(12) United States Patent
Rath et al.

(10) Patent No.: US 6,254,796 B1
(45) Date of Patent: Jul. 3, 2001

(54) SELECTIVE ETCHING OF SILICATE

(75) Inventors: David L. Rath, Stormville, NY (US); Glenn W. Gale, Austin, TX (US); Rangarajan Jagannathan, Essex Junction, VT (US); Kenneth J. McCullough, Fishkill, NY (US); Karen P. Madden, Poughquag, NY (US); Harald F. Okorn-Schmidt, Putnam Valley, NY (US); Keith R. Pope, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/221,596

(22) Filed: Dec. 29, 1998

Related U.S. Application Data

(63) Continuation of application No. 08/881,911, filed on Jun. 25, 1997, now abandoned.

(51) Int. Cl.[7] ............................. H01L 21/302; B44C 1/22

(52) U.S. Cl. ............................ 216/87; 216/97; 216/99; 438/751; 438/756; 438/705

(58) Field of Search .................................. 216/87, 97, 98, 216/99; 438/756, 751, 705

(56) References Cited

U.S. PATENT DOCUMENTS

| | | | |
|---|---|---|---|
| 3,979,241 | 9/1976 | Maeda et al. | 156/13 |
| 4,230,523 | 10/1980 | Gagda | 156/657 |
| 4,269,654 | 5/1981 | Deckert et al. | 156/657 |
| 4,334,349 | 6/1982 | Aoyama et al. | 29/579 |
| 4,395,304 | 7/1983 | Kern et al. | 156/657 |
| 5,012,692 | 5/1991 | Nagano | 74/475 |
| 5,281,350 | 1/1994 | Gimm et al. | 252/79.1 |
| 5,320,709 | 6/1994 | Bowden et al. | 156/667 |
| 5,571,375 | * 11/1996 | Izumi et al. | 156/646.1 |
| 5,824,601 | 10/1998 | Dao et al. | 438/713 |
| 6,024,888 | * 2/2000 | Watanabe et al. | 216/73 |
| 6,033,996 | * 3/2000 | Rath et al. | 438/756 |

FOREIGN PATENT DOCUMENTS

| | | |
|---|---|---|
| 238622 | 8/1986 | (DD) . |
| 56-161677 | * 12/1981 | (JP) . |
| 58-110078 | * 6/1983 | (JP) . |
| 58-204540 | * 11/1983 | (JP) . |
| WO9702958 | 1/1997 | (WO) . |

* cited by examiner

*Primary Examiner*—Gregory Mills
*Assistant Examiner*—George Goudreau
(74) *Attorney, Agent, or Firm*—Connolly Bove Lodge & Hutz; Jay H. Anderson

(57) ABSTRACT

A silicate glass is selectively etched employing a composition containing a fluoride containing compound and certain organic solvents. Preferred compositions also include water.

20 Claims, No Drawings

SELECTIVE ETCHING OF SILICATE

This application is a continuation of U.S. application Ser. No. 08/881,911 which was filed on Jun. 25, 1997, and is now abandoned.

TECHNICAL FIELD

The present invention is concerned with selectively etching a silicate and particularly selectively etching a silicate at a rate greater than for silicon dioxide. In addition, the present invention is concerned with certain etching compositions that are suitable for selectively etching a silicate at a rate greater than the rate for silicon dioxide.

BACKGROUND ART

In the fabrication of microelectronic components, a number of the steps involved, for instance, in preparing integrated circuit chips and the packaging for the chips (articles to which the chips are attached and protected), are etching processes. Accordingly, over the years, a number of vastly different types of etching processes to remove material, sometimes in selective areas, have been developed and are utilized to varying degrees. Moreover, the steps of etching different layers which constitute, for instance, the finished integrated circuit chip are among the most critical and crucial steps.

One method widely employed for etching is to overlay the surface to be etched with a suitable mask and then immerse the surface and mask in a chemical solution which attacks the surface to be etched, while leaving the mask intact and while only etching other materials of the article to at most, a minimum extent.

The problem of selectivity is especially pronounced when silicon dioxide is present on the same article as a silicate glass and is also exposed to the composition used to etch the silicate glass. This requires superior cleaning or etching solutions that exhibit extremely high selectivities in etching between the silicate glass and the silicon dioxide material.

It would therefore be desirable to provide a selective etching procedure that exhibits high selectivity for the silicate as well as achieving excellent removal.

SUMMARY OF INVENTION

The present invention is concerned with a method for selectively etching a silicate glass. The process of the present invention comprises contacting an article that contains silicate glass and silicon dioxide with an etching composition that contains about 0.05 to about 3 molar of a fluoride containing compound and an organic solvent to thereby selectively etch the silicate glass at a rate greater than the rate for the silicon dioxide.

In addition, the present invention is concerned with certain preferred etching compositions that are capable of selectively etching silicate glass at a rate greater than the rate for silicon oxides. The preferred compositions of the present invention contain about 0.05 to about 3 molar of a fluoride containing compound, an organic solvent, and about 0.05 to about 3 molar of water.

The organic solvents employed in the present invention typically have relatively high flash point and provide low viscosity compositions. Suitable solvents include sulfolanes, oxolanes, esters, ketones, aldehydes, lactones, halogenated hydrocarbons, monohydric alcohols, amines and imides.

Other objects and advantages of the present invention will become readily apparent to those skilled in this art from the following detailed description, wherein it shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BEST AND VARIOUS MODES FOR CARRYING OUT INVENTION

The present invention is concerned with selectively etching a silicate glass and especially a silicate glass that has been doped with boron, arsenic, antimony and/or phosphorous. The doped silicate glass to be etched, according to the present invention, typically contains about 0.5 to about 10 percent by weight and preferably about 3 to about 7 percent by weight of the dopant. Moreover, the silicate is present in an article that also includes silicon dioxide, wherein both the silicate and silicon dioxide will come in contact with the etching composition. The present invention provides for selectively etching the silicate glass at a rate of at least about 100 times the rate for the silicon dioxide. The silicon dioxide is preferably high density silicon dioxide. High density silicon dioxide refers to thermally grown silicon dioxide or silicon dioxide that is chemically vapor deposited (CVD) or physically vapor deposited (PVD) followed by thermal annealing.

The etching compositions employed pursuant to the present invention contain a compound containing fluoride and an organic solvent. The amount of the fluoride containing compound in the composition is about 0.5 to about 3 molar, and preferably about 0.2 to about 2.5 molar, and most preferably about 0.25 to about 1.5 molar.

Typical compounds providing a fluoride source according to the present invention are hydrofluoric acid, ammonium fluoride, fluoroborates, fluoroboric acid, tin bifluoride, antimony fluoride, tetrabutylammonium tetrafluoroborate, and aluminum hexafluoride. Also, a fluoride salt of an aliphatic primary, secondary or tertiary amine can be used. Such have the following formula:

$R_1N(R_3)R_2$ wherein $R_1$, $R_2$ and $R_3$ each individually represent H or an alkyl group. Typically, the total number of carbon atoms in the $R_1$, $R_2$ and $R_3$ groups is 12 carbon atoms or less. The preferred fluoride compounds are hydrogen fluoride and ammonium fluoride.

The hydrogen fluoride is typically employed as a 49 weight percent aqueous solution.

Examples of suitable organic compounds include oxolanes, sulfolanes, esters, ketones, aldehydes, lactones, halogenated solvents, amines, imides and monohydric alcohols. Examples of suitable esters are esters of carbonic acids, benzoic acid, phthalic acid, isophthailc acid and terephthalic acid, and especially the $C_1$–$C_6$ alkyl esters. Preferred organic solvents are propylene carbonate, N-methyl pyrrolidone, gamma butyrolactone, methylene chloride, benzyl alcohol, N-formyl morpholine, N-formyl piperidine, cyclohexanone, cyclopentanone, methyl benzoate, diglyme, 2-methyl tetrahydrofuran, and methyl and ethyl esters of phthalic, isophthalic or terephthalic acids. The more preferred solvents employed pursuant to the present invention are propylene carbonate, N-methylpyrrolidone and gamma butyrolactone, with propylene carbonate being the most preferred.

Organic solvents employed in the present invention provide for low viscosity compositions, which in turn render the compositions more workable and providing for better etch uniformity. This is especially so when compared to using polyhydric alcohols such as glycerol and ethylene glycol.

According to preferred aspects of the present invention, the compositions also include water. Typically, when present, the water is employed in an amount of about 0.05 to about 3.5 molar, preferably about 0.2 to about 2.9 molar, and most preferably about 0.1 to about 1.7 molar. However, it should be understood that compositions of the present invention do not require water.

The etching process of the present invention is typically carried out at temperatures of about 20° C. to about 90° C., and preferably about 30° C. to about 70° C. Employing increased temperature results in increasing the etch rates of the silicate and the silicon dioxide. The increase in the etch rate due to increased temperature will be somewhat greater for the silicate glass than for the silicon dioxide, thereby somewhat increasing the selectivity of the etching of the silicate glass.

The following non-limiting examples are presented to further illustrate the present invention.

EXAMPLE 1

An etching composition is prepared by admixing one part by volume of a 49 percent by weight aqueous solution of HF with about 28 parts by volume of propylene carbonate to provide a one molar HF solution in propylene carbonate. A blanket silicon wafer having a layer of thermally grown silicon dioxide beneath a layer of silicon nitride which in turn is beneath a layer of 6 weight percent boron doped silicate glass is contacted with this etching composition. The article includes vias thereby exposing the walls of the vias of the underlying layers, i.e. silicon nitride and silicon dioxide, to the etchant. The etching is carried out at room temperature. The etching solution etches the boron doped silicate glass at a rate of about 125 nanometers/minute and the silicon dioxide at a rate of only about 0.6 nanometers per minute. This results in a selectivity of boron silicate glass etching relative to the silicon dioxide of over 200:1.

EXAMPLE 2

Example 1 is repeated except that the water content of the solution is twice as much as in Example 1. This composition etches the boron doped silicate glass at a rate of about 140 nanometers/minute and the silicon dioxide at a rate of about 1.2 nanometers per minute. Accordingly, the selectivity of the etch rate is about 115:1.

EXAMPLE 3

Example 1 is repeated except that the composition is prepared by admixing about 1 part by volume of 49 percent by weight of an aqueous HF solution and about 115 parts by volume of propylene carbonate, and the etching is carried out at about 60° C. The etch rate for the silicate glass is 615 angstroms per minute and for the silicon dioxide is 3.6 angstroms per minute. Accordingly the selectivity of the etch rate is about 170:1.

In this disclosure, there are shown and described only the preferred embodiments of the invention, but as aforementioned, it is to be understood that the invention is capable of use in various other combinations and environments and is capable of changes or modifications within the scope of the inventive concept as expressed herein.

What is claimed is:

1. A method for selectively etching a silicate glass which comprises contacting an article containing said silicate glass and a silicon dioxide with an etching composition containing 0.05 to 3 molar of a fluoride containing compound and an organic solvent, wherein said solvent is selected from the group consisting of sulfolanes, esters, aldehydes, lactones, halogenated hydrocarbons, amines and imides, to thereby selectively etch said silicate glass at a rate greater than said silicon dioxide.

2. The method of claim 1 wherein said silicon glass is a silicate glass doped with at least one member selected from the group consisting of boron, arsenic, antimony and phosphorous.

3. The method of claim 1 wherein said silicate glass is a boron doped glass.

4. A method for selectively etching a silicate glass wich comprises contacting an article containing said silicate glass and a silicon dioxide with an etching composition containing about 0.05 to about 3 molar of a fluoride containing compound and an organic solvent, wherein said organic solvent is selected from the group consisting of propylene carbonate, N-methyl pyrrolidone, gamma butyrolactone, methylene chloride, benzyl alcohol, N-formyl morpholine, N-formyl piperidine, cyclohexanone, cyclopentanone, methyl benzoate, diglyme, 2-methyl tetrahydrofuran, methyl and ethyl esters of acid selected from the group consisting of phthalic acid, isophthalic acid and terephthalic acid, to thereby selectively etch said silicate glass at a rate greater than said silicon dioxide.

5. The method of claim 4 wherein said organic solvent is selected from the group consisting of propylene carbonate, N-methyl pyrrolidone and gamma butyrolactone.

6. The method of claim 4 wherein said solvent is propylene carbonate.

7. The method of claim 1 wherein said fluoride containing compound is selected from the group consisting of hydrofluoric acid, ammonium fluoride, fluoroborates, tetrabutylammonium tetrafluoroborate, fluoroboric acid, aluminum hexafluoride, tin biflouride, antimony fluoride and fluoride salt of an aliphatic primary, secondary or tertiary amine.

8. The method of claim 1 wherein said fluoride containing compound is hydrofluoric acid or ammonium fluoride.

9. The method of claim 1 wherein said fluoride containing compound is hydrofluoric acid.

10. The method of claim 1 wherein said silicon dioxide is high density silicon dioxide.

11. The method of claim 10 wherein said silicon dioxide is selected from the group consisting of thermally grown silicon dioxide, chemically vapor deposited thermally annealed silicon dioxide and physically vapor deposited thermally annealed silicon dioxide.

12. The method of claim 10 wherein said silicon dioxide is thermally grown silicon dioxide.

13. The method of claim 1 wherein said composition farther contains water.

14. The method of claim 13 wherein the amount of water is 0.05 to 3.5 molar.

15. The method of claim 13 wherein the amount of water is 0.2 to 2.9 molar.

16. The method of claim 13 wherein the amount of water is 0.25 to 1.7 molar.

17. The method of claim 1 wherein the amount of said fluoride is 0.2 to 2.5 molar.

18. The method of claim 1 wherein the amount of said fluoride is 0.25 to 1.5 molar.

19. The method of claim 1 wherein the contacting with said composition is carried out at a temperature of 20° C. to 90° C.

20. The method of claim 1 wherein the contacting with said composition is carried out at a temperature of 30° C. to 70° C.

* * * * *

UNITED STATES PATENT AND TRADEMARK OFFICE
CERTIFICATE OF CORRECTION

PATENT NO. : 6,254,796 B1
DATED : July 3, 2001
INVENTOR(S) : David L. Rath et al.

It is certified that error appears in the above-identified patent and that said Letters Patent is hereby corrected as shown below:

<u>Column 2,</u>
Line 1, after "it" insert -- is --.

Signed and Sealed this

Fifth Day of March, 2002

*Attest:*

JAMES E. ROGAN
*Attesting Officer*    Director of the United States Patent and Trademark Office